United States Patent [19]

Rapp

[11] Patent Number: 4,692,635
[45] Date of Patent: Sep. 8, 1987

[54] SELF-TIMED LOGIC LEVEL TRANSITION DETECTOR

[75] Inventor: A. Karl Rapp, Los Gatos, Calif.

[73] Assignee: National Semiconductor Corp., Santa Clara, Calif.

[21] Appl. No.: 878,635

[22] Filed: Jun. 26, 1986

[51] Int. Cl.[4] .......................................... H03K 3/356
[52] U.S. Cl. ............................... 307/279; 307/200 B; 307/448; 307/481; 307/269
[58] Field of Search ............... 307/200 A, 200 B, 443, 307/448, 449, 451–453, 480–481, 269, 279, 272 A; 365/230, 233

[56] References Cited

U.S. PATENT DOCUMENTS

| | | | |
|---|---|---|---|
| 3,976,949 | 8/1976 | Hepworth et al. | 307/448 X |
| 4,386,284 | 5/1983 | Wacyk et al. | 307/448 X |
| 4,518,872 | 5/1985 | Backes | 307/449 X |
| 4,563,599 | 1/1986 | Donoghue et al. | 307/448 |
| 4,570,091 | 2/1986 | Yasuda et al. | 307/463 X |
| 4,587,445 | 5/1986 | Kanuma | 307/443 |
| 4,614,883 | 9/1986 | Sood et al. | 307/562 X |
| 4,618,786 | 10/1986 | Johnson | 307/200 B X |

Primary Examiner—Stanley D. Miller
Assistant Examiner—D. R. Hudspeth
Attorney, Agent, or Firm—Limbach, Limbach & Sutton

[57] ABSTRACT

A self-timed transition detector is provided that responds to a change in the logic level of a signal by generating a change-indicator flag. The change-indicator flag is held active until an event initiated by the change-indicator flag has been completed. Completion of the event cancels the change-indicator flag, thereby verifying the completion of the event.

7 Claims, 5 Drawing Figures

1

SELF-TIMED LOGIC LEVEL TRANSITION DETECTOR

BACKGROUND OF THE INVENTION

1. Field of the Invention

This invention relates to electrical circuits and, more particularly, to circuitry for detecting a change in the logic level of a signal and for generating a self-timed flag indicative of the change.

2. Discussion of the Prior Art

Memories and other integrated circuits which externally appear static, i.e., responsive to logic levels rather than level transitions, but which internally utilize clock signals for timing control, require some method for detecting input signal transitions.

The conventional method for detecting such transitions utilizes a delay through a series of logic elements to generate brief signal-overlap times and thereby produce short pulses. FIG. 1 illustrates a logic implementation of one such prior art transition detector. The transition detector shown in FIG. 1 utilizes an odd number of stages, sufficient in number to provide the required pulse width. This approach requires careful control of signal delays to ensure detection, that is, to avoid missing pulses that are too brief.

SUMMARY OF THE INVENTION

The transition detector of the present invention ensures recognition of each signal change by holding a change-indicator flag active until the output state of a bistable device changes, thereby acknowledging the transition. The change-indicator flag is self-timed in that it remains active only long enough to cancel itself.

Correct operation of this self timed transition detector is independent of signal delays and, therefore, in integrated circuit implementation, is independent of process variations.

BRIEF DESCRIPTION OF THE DRAWING

FIG. 5 is a schematic block diagram of a system which utilizes the transition detector of the present invention.

DETAILED DESCRIPTION OF THE PREFERRED EMBODIMENT

Figure 1:
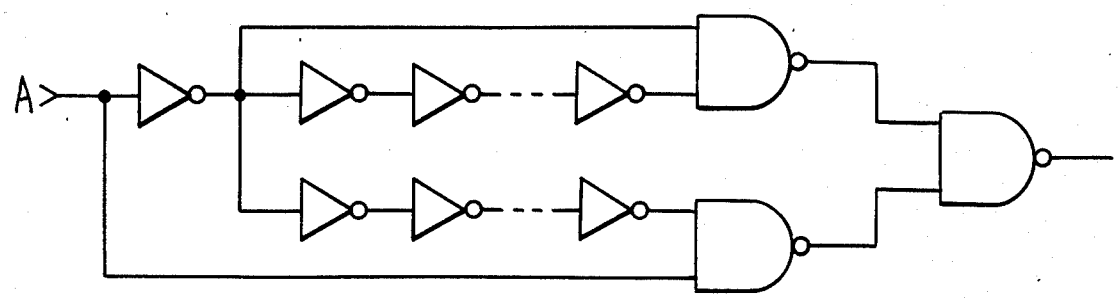
FIG. 1 is a schematic logic diagram illustrating a conventional, prior art transition detector.
Figure 2:
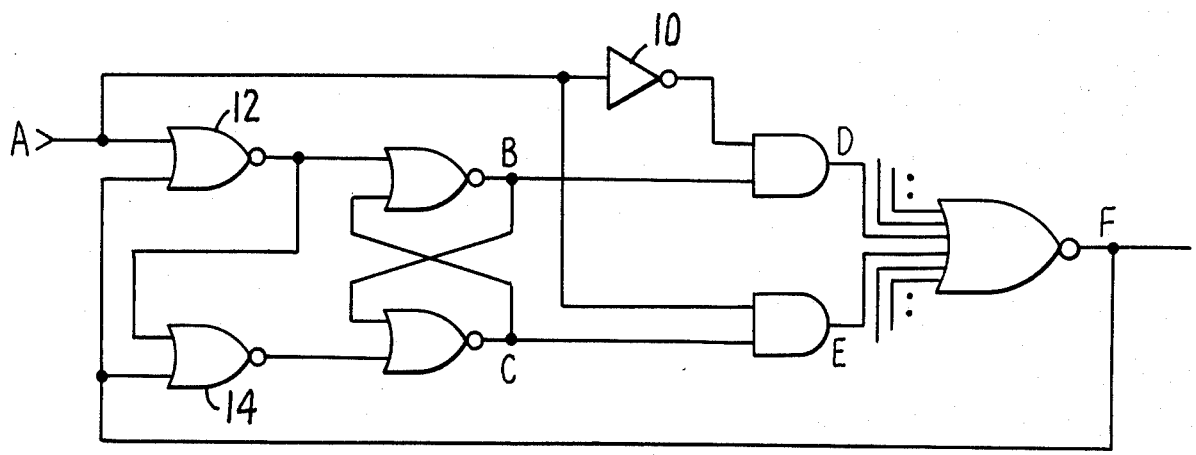
FIG. 2 is a schematic diagram illustrating one logic configuration of an input signal transition detector according to the present invention.

FIG. 2 illustrates one possible logic configuration which implements the logic level transition detection concept of the present invention. The logic level of an input signal A is continuously compared with the state of a latch B/C which stores the previous input logic level. Each change in input signal A enables one of the comparator AND gates D or E to pull down a change-indicator flag F. The change-indicator flag F remains low until the gate latch B/C assumes the new input state and, in dong so, cancels the change-indicator flag F.

For example, referring to FIG. 2, assume that at any given time $t_0$, the input signal A is low and the state latch B/C is latched with B low and C high. Thus, the two inputs to AND gate D at time $t_0$ are the low output of node B and the high output of invertor 10. The two inputs to AND gate E are the low input signal A and the high output of node C. As illustrated in FIG. 2, the AND gates associated with each input (two per input) are OR-tied, resulting in the change-indicator flag F being high (inactive) at time $t_0$.

When the input signal A changes from low to high, AND gates D and E compare the new input signal logic level with the stored outputs of latch B/C. Because both inputs to AND gate E are now high, the change-indicator flag F is made to go low (active). The low change-indicator flag F is then fed back through NOR gates 12 and 14, enabling them to latch the new state into latch B/C; i.e., node B now goes high and node C goes low. This change in the output of latch B/C causes the comparison made by AND gates D and E to cancel the change-indicator flag F; i.e., node F returns to its high state until the next logic level transition of input signal A.

Figure 3:
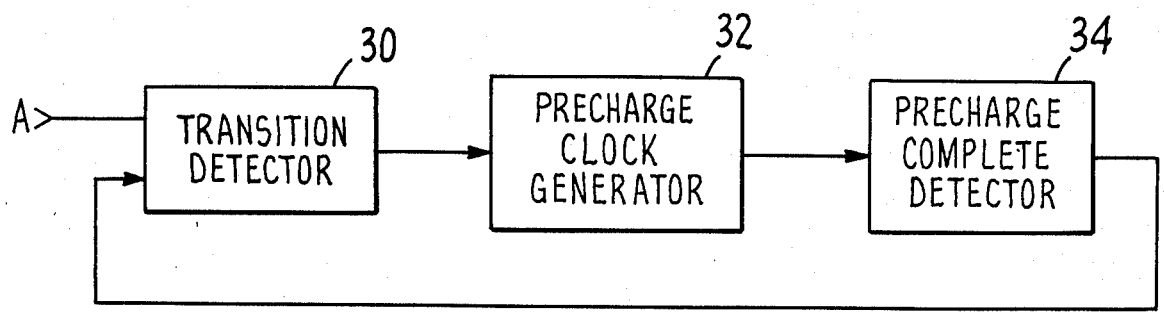
FIG. 3 is a schematic diagram of a circuit which implements the logic diagram shown in FIG. 2.
Figure 3:
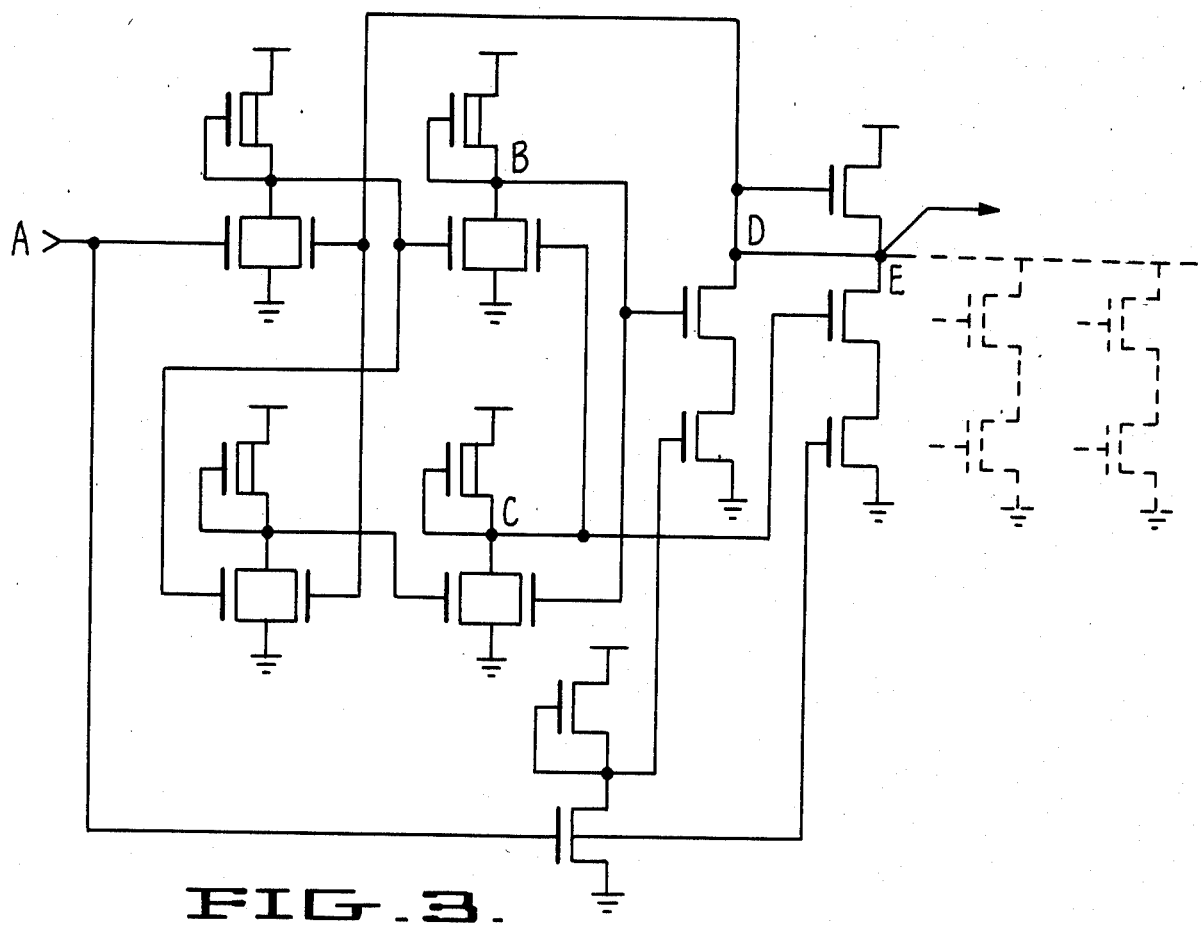

FIG. 3 shows an N-channel MOS circuit implementation of the logic diagram shown in FIG. 2.

Figure 4:
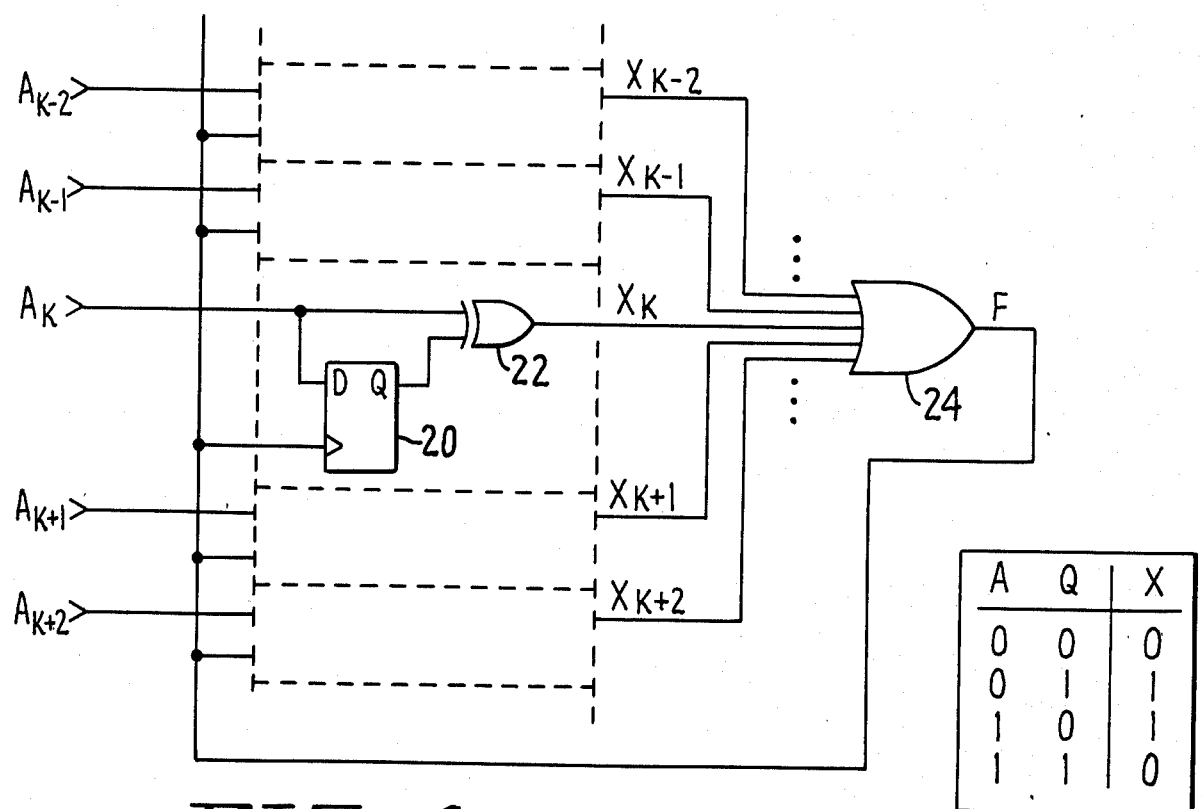
FIG. 4 is a schematic diagram illustrating a more general logic configuration of an input signal transition detector according to the present invention.

FIG. 4 shows a more general logic configuration for implementing the transition detector of the present invention. As shown in FIG. 4, according to this embodiment of the invention, an input signal A is provided both to the data-in port of a D-type flip-flop 20 and to an exclusive-OR gate 22. A change in the logic level of input signal A causes the output $X_k$ of X-OR gate 22 to change which, in turn, causes OR gate 24 to raise change-indicator flag F. The change-indicator flag F is fed back to clock the flip-flop 20, causing it to output the new input state, thus cancelling the change-indicator flag F.

In the embodiment of the invention illustrated in FIGS. 2 and 4, the change-indicator flag F is fed back directly to a bistable device of the transition detection circuit to cancel the change-indicator flag F.

A more general configuration, shown in FIG. 5, uses the termination of a later event, initiated by the change-indicator flag F, as the feedback signal. In this way, completion of the event is assured before the change-indicator flag F is cancelled. FIG. 5 shows an input signal A which is provided to a transition detector 30 of the type described above. A change in the logic level of input signal A causes the transition detector 30 to generate a change-indicator flag F. In the embodiment shown in FIG. 5, the change-indicator flag F initiates an on-chip precharge clock 32. Thus, an on-chip clock is generated whenever an input logic level transition is detected. The clock width is self-timed by feeding the output of a pre-charge complete detecter 34 back to the transition detector 30 to cancel the change-indicator flag F, thereby terminating the clock.

It should be understood that various alternatives to the embodiments of the invention described herein may be employed in practicing the present invention. It is intended that the following claims define the invention, and that the structure and methods within the scope of these claims and their equivalents be covered thereby.

What is claimed is:

1. A self-timed transition detector for detecting a change in the logic level of an input signal, said detector comprising:

storage means for storing a signal indicative of the logic level of the input signal, coupled to receive the input signal;

means responsive to a change in the logic level of the input signal to generate a change-indicator flag, said change-indicator flag being fed back to said storage means to update said stored signal to be indicative of said changed logic level of the input signal, said storage means being responsive to receipt of said change-indicator flag to generate an output which cancels the change-indicator flag when the stored signal is updated.

2. A self-timed transition detector for detecting a change in the logic level of an input signal, said transition detector comprising:

a state latch which stores an output state representative of the logic level of the input signal, coupled to receive the input signal;

comparison means responsive to a change in the logic level of the input signal to generate a change-indicator flag, said change-indicator flag being provided as a control input to said state latch causing the output state of said latch to conform to the input logic level, such conformance thereby cancelling said change-indicator flag.

3. A self-timed transition detector for detecting a change in the logic level of a signal, said transition detector comprising:

comparison means which receives said signal as a first input, said comparison means being responsive to a change in the logic level of said first input to generate a change-indicator flag;

a bistable device which receives said signal and which receives said change-indicator flag as a control input and causes its state to conform to the input logic level in response thereto;

said comparison means being responsive to said change of state of said bistable device to cancel said change-indicator flag upon said change of state.

4. A transition detector as in claim 3 wherein said bistable device is a latch.

5. A transition detecter as in claim 3 wherein said bistable device is a D-type flip-flop.

6. A method of detecting a change in the logic level of an input signal, said method comprising the steps of:

receiving the input signal and storing a status signal representative of the logic level of the input signal;

generating a change-indicator flag in response to a change in the logic level of the input signal;

updating said status signal in response to the generation of said change-indicator flag such that said updated status signal is representative of said changed logic level of said input signal;

storing said updated status signal; and cancelling said change-indicator flag upon the updating of said status signal.

7. A method of verifying the completion of an event, said method comprising:

receiving the input signal and storing a status signal representative of the logic level of said input signal;

generating a change-indicator flag in response to a change in the logic level of said input signal;

initiating the event upon the generation of said change-indicator flag;

detecting the completion of the event and generating a completion signal thereon;

updating said status signal in response to generation of said completion signal such that said updated status signal is representative of said changed logic level of said input signal;

storing said updated status signal; and cancelling said change-indicator flag upon the updating of said status signal, thereby verifying completion of the event.

* * * * *